United States Patent [19]
Errichiello

[11] Patent Number: 5,559,677
[45] Date of Patent: Sep. 24, 1996

[54] METHOD OF FORMING A DEVICE BY SELECTIVELY THERMAL SPRAYING A METALLIC CONDUCTIVE MATERIAL THEREON

[75] Inventor: Dominic R. Errichiello, Roselle, Ill.

[73] Assignee: Motorola, Inc., Schaumburg, Ill.

[21] Appl. No.: 386,416

[22] Filed: Feb. 14, 1995

Related U.S. Application Data

[62] Division of Ser. No. 235,612, Apr. 29, 1994, abandoned.
[51] Int. Cl.$^6$ ................................................ H05K 9/00
[52] U.S. Cl. .................. 361/816; 361/796; 361/800; 361/818; 174/35 R
[58] Field of Search .................. 361/752, 796, 361/800, 816, 818; 174/35 R, 35 MS; 29/25.35; 427/239; 228/121, 215

[56] References Cited

U.S. PATENT DOCUMENTS 4,532,152  7/1985  Elarde ........................... 427/96
4,890,199  12/1989  Beutler ........................ 361/424
5,313,371  5/1994  Knecht et al. ................ 361/818

Primary Examiner—Leo P. Picard
Assistant Examiner—Y. Whang
Attorney, Agent, or Firm—Wayne J. Egan

[57] ABSTRACT

The method disclosed herein begins with a molded housing (13 or 31). In one embodiment (20) the molded housing (13) has a ground shield (14) that is formed by thermally spraying a metallic conductive material onto the housing (13). Electrical connections are then made to link an electronic circuit on a printed circuit board assembly (21) to the ground shield (14). In another embodiment (30), the molded housing (31) has a plurality of elements (such as an indented channel (32), extrusions (33), a slot connector (34), and a notch (35)) that are thermally sprayed in selected areas to form a plurality of connective elements required by the electronic circuit of the printed circuit board assembly.

7 Claims, 1 Drawing Sheet 5,559,677

METHOD OF FORMING A DEVICE BY SELECTIVELY THERMAL SPRAYING A METALLIC CONDUCTIVE MATERIAL THEREON

This is a divisional application of prior application Ser. No. 08/235,612 filed on Apr. 29, 1994, now abandoned, of Dominic R. Errichiello, the same inventor as in the present application, which prior application is assigned to Motorola, Inc., the same assignee as in the present application, and which prior application is hereby incorporated by reference verbatim, with the same effect as though the prior application were full and completely set forth herein.

FIELD OF THE INVENTION

This invention relates generally to electronic devices, and particularly to molded housings for electronic devices.

BACKGROUND OF THE INVENTION

A housing provides an external physical frame for an electronic device. In such an electronic device, the housing encloses an assembly of electronic components forming at least one electronic circuit. Typically, these electronic components are placed onto a circuit board that is known in the art as a printed circuit board assembly (PCBA). A main PCBA can include smaller PCBAs known as modules. These modules, when operably connected to function together on the main PCBA, form the electronic device.

There are different methods used to fabricate the above housing. One method uses a mold that provides a required final shape for the housing. In one type of molding method, the molding material (a liquid resin) is applied to the mold in a process known as injection molding. After curing the liquid resin in the mold, the end product is called a molding or, for the above housing, a molded housing.

A molded housing is three dimensional and can include a variety of slots, holes, or any extrusive or indented physical features. Such physical features allow a variety of other devices (mechanical or electrical) to connect to the electronic device enclosed within the molded housing. For example, in a typical telephone set, a telephone wire connects two electronic devices, a handset and a base unit. The interfacing connectors of the wire and the two electronic devices sit in two holes, one on each of the molded housing of the two electronic devices.

In a molded housing for an electronic device, effective use of the molded housing enables the electronic device to meet its expected electrical and mechanical design requirements. An example of such a design requirement is the placement of a ground shield needed for a ground signal reference. (The ground shield is typically a metallized plate or a metallized layer on a printed circuit board.) For an effective ground signal reference, the electronic circuit requires at least one electrical connection to the ground shield. In addition to the ground shield, an RF shield is another electrical requirement for some electronic devices, particularly when RF signals leak excessively into the external environment from the circuitry of the electronic devices.

Placing a metallized shield for the purposes stated above requires efficient usage of the available space within the electronic device's housing, especially when the metallized shield is a core layer of a printed circuit board of the electronic device or a metal plate covering a module on the PCBA. As electronic devices continually decrease in size to meet consumer requirements, usage of space for elements like metallized shields becomes an important design requirement. Therefore, a need exists to place metallized shields effectively in electronic devices, and yet take up as little space as possible.

Other than the metallized shields described above, connecting elements (such as cable connectors or mounting brackets) form another part of the electronic device. These connecting elements are typically affixed on the molded housing or on the printed circuit board to provide connections to other devices. For example, a computer has plugs and jacks for connecting to a multitude of other devices, such as a display or a keyboard. Not only do these connectors add to the cost of the electronic device, they also take up a substantial amount of space on circuit boards enclosed within the housing of the electronic device. Therefore, a need also exists to reduce or eliminate elements in an electronic device (such as cable connectors or mounting brackets) in order to maximize the efficient usage of circuit board and housing spaces within the electronic device, and to minimize the cost of the electronic device itself.

DESCRIPTION OF A PREFERRED EMBODIMENT

Figure 1:
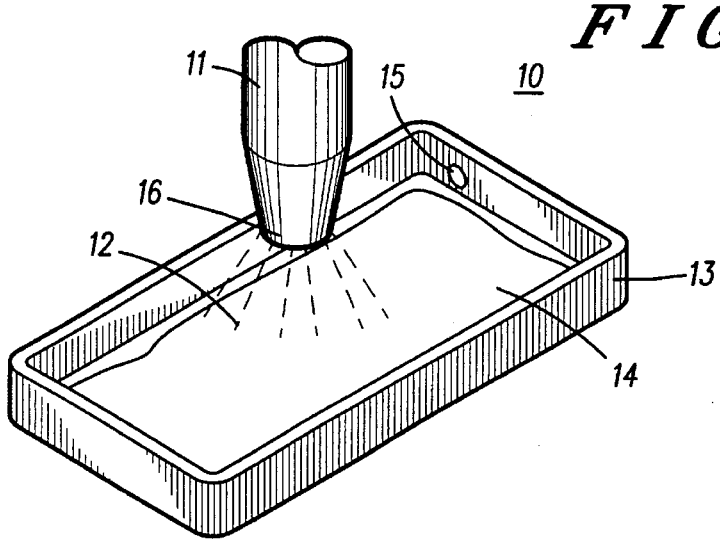
FIG. 1 shows a perspective view of a molded housing thermally sprayed with a thermal spray gun to apply a metallic conductive layer in accordance with the present invention.

In accordance with an embodiment of the present invention, FIG. 1 shows a thermal spray gun (11) applying a metallic conductive material (12) onto a housing (13) for a desired ground shield (14). The housing also includes a hole (15) on the housing for placing a connector that enable links from an electronic circuit within the housing to a plurality of devices external to the housing (13).

In the art, the thermal spray gun (11) is commercially available (such as METCO's DJ Diamond Jet gun) to apply the metallic conductive material (12), such as copper, silver, or gold. Typically, as shown in FIG. 1, the housing (13) is positioned such that the thermal spray gun's nozzle (16) is perpendicular to the desired ground shield (14) of the housing (13) and at a distance of between 25 centimeters to 50 centimeters (as recommended by METCO for general usage).

This method of thermally spraying a metallic conductive material (12) is well known in the art and references include U.S. Pat. No. 4,424,408, entitled HIGH TEMPERATURE CIRCUIT BOARD, and U.S. Pat. No. 4,532,152, entitled FABRICATION OF A PRINTED CIRCUIT BOARD WITH METAL-FILLED CHANNELS, both patents assigned to Elarde.

Figure 2:
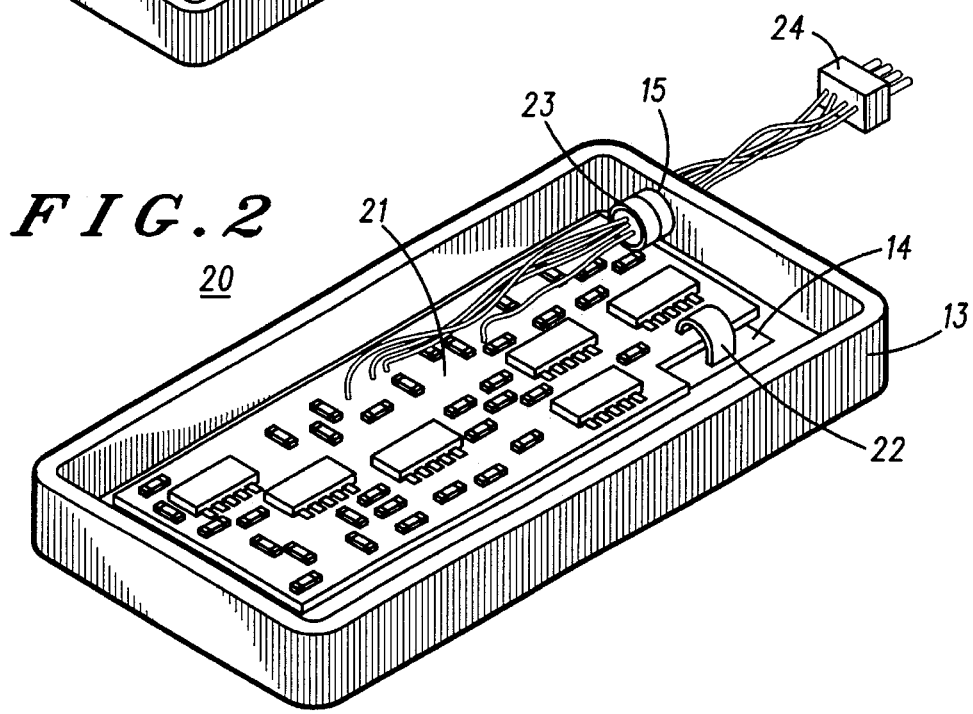
FIG. 2 shows a perspective view of the molded housing with a printed circuit board assembly placed within the molded housing in accordance with the present invention.

The housing (13), complete with the ground shield (14), is shown in FIG. 2. Also shown in FIG. 2 is a printed circuit board assembly (PCBA) (21) with a plurality of electronic components forming an electronic circuit. One joint (22)

connects the electronic circuit to the ground shield (14). In addition, the hole (15) contains a connector (23) that links to a wired plug (24) for connecting to a plurality of external devices.

Thermal spraying of a material layer onto a substrate is known to have significant advantages over other methods of applying such a material layer. METCO has shown that the bonding strength between a thermally sprayed material layer and an underlying substrate is stronger when compared to the material layer and underlying substrate bonded by other known methods (such as electrochemical plating). With a stronger bond, the thermally plated material layer will not be easily removed by abrasive forces or high temperatures. In the present technology of electrochemical plating, strips of copper are lifted when excessive heat is applied to the strips. (The extreme thermal condition causes the bond to break because of a difference in the thermal expansion of the strip and the underlying substrate material of a printed circuit board). Another advantage of thermal spraying is the reduced wastage of the sprayed material, as most of the unused sprayed material is easily recoverable. To those skilled in the art, thermal spray systems utilize, overall, more than 99% of the available material (as opposed to a typical 25% waste in conventional electrochemical plating).

Figure 3:
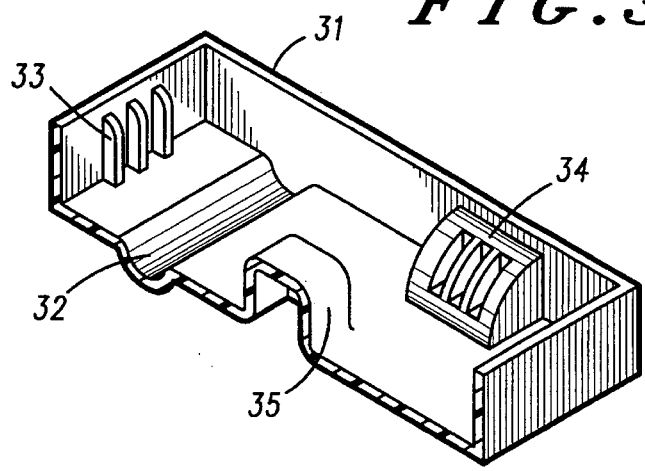
FIG. 3 shows a perspective view of a molded housing with a plurality of physical features having a metallic conductive material selectively plated thereon in accordance with the present invention.

An alternative embodiment in accordance with the present invention is shown in FIG. 3 as a three-dimensional molded housing (31) with a plurality of molded elements. Typically, a plastic is used to form the material base for the molded housing (31). The molded housing (31) is thermally sprayed in selected areas of the plurality of molded elements to apply the metallic conductive material. One such selected area is a molded element plated with the metallic conductive material and shown as an indented channel (32) that serves as a ground channel for an electronic circuit PCBA (not shown). The ground channel is use for connecting an electrical ground for different parts of an electronic circuit placed within the molded housing (31).

In addition, FIG. 3 also shows another molded element with three extrusions (33) that are thermally sprayed with the metallic conductive material. Such extrusions (33) provide electrical couplings for adjacent parts of an electronic circuit mounted on a PCBA. The molded extrusions (33) eliminate the need for a connector to link the electronic circuit of the PCBA when such a need arises. Furthermore, the extrusions (33) will connect directly to the electronic circuit by soldering and hence, provide a firmer link compared with a surface contact as in any other type of non-soldered connectors.

Besides interconnecting the different parts of an electronic circuit, connectors also link the electronic circuit to a plurality of external devices. Such a connector can be implemented on the molded housing (31) by means of another molded element such as a molded slot connector (34) shown in FIG. 3. The grooves within the molded slot connector (34) are thermally plated with the metallic conductive material and allows an external device to plug into the molded slot connector (34).

Referring once again to FIG. 3, another plated physical feature is a molded notch (35). This notch (35) allows the molded housing (31) to fit onto another device or one other molded housing. When plated with a metallic conductive material, the notch (35) also serves as an electrical connection linking this molded housing (31) to the other molded housing. In such a housing notch (35), thermally spraying a metallic layer onto the inner or outer surface of the notch (35) provides more durability to the connection (as described above in terms of the bonding strength of the metallic conductive material and the underlying plastic substrate).

Applying the above novel embodiment in accordance with the present invention reduces the number of connectors that add to the overall cost of the electronic device. Furthermore, using connectors in the existing methods also add one additional step in the assembly of the PCBA whereby the connector is affixed onto a printed circuit board. On the other hand, the molded elements serving as connectors in the above novel embodiment are built into the molded housing (31).

With increasing competition in the market for electronic devices, cost and effectiveness are major factors determining the design of such electronic devices. Methods to reduce the manufacturing cost of an electronic device will include eliminating unnecessary components (such as connectors). As for device effectiveness, improving the design (such as reducing device dimensions or increasing mechanical durability) is one main approach. Therefore, a need exists for electronic devices to have thermally sprayed molded features or elements to reduce cost and increase device effectiveness.

What is claimed is:

1. An electronic device comprising:
   (a) a printed circuit board assembly having a plurality of electronic components forming an electronic circuit;
   (b) a three-dimensional molded housing comprised of plastic, the three-dimensional molded housing including:
       (i) an inner surface disposed about the electronic circuit, wherein at least a part of the inner surface has a ground shield comprised of a metallic conductive material thermally sprayed thereon; and
       (ii) a plurality of molded elements, wherein selected areas of the plurality of molded elements are thermally sprayed with a metallic conductive material.

2. The electronic device of claim 1, wherein the metallic conductive material is comprised of copper.

3. The electronic device of claim 1, wherein the metallic conductive material is comprised of silver.

4. The electronic device of claim 1, wherein the metallic conductive material is comprised of gold.

5. The electronic device of claim 1, wherein the plurality of molded elements includes an indented channel.

6. The electronic device of claim 1, wherein the plurality of molded elements includes a notch.

7. An electronic device comprising:
   (a) a printed circuit board assembly having a plurality of electronic components forming an electronic circuit;
   (b) a three-dimensional molded housing comprised of plastic, the three-dimensional molded housing including;
       (i) an inner surface disposed about the electronic circuit, wherein at least a part of the inner surface has a ground shield comprised of a metallic conductive material thermally sprayed thereon; and
       (ii) a plurality of molded elements, wherein selected areas of the plurality of molded elements are thermally sprayed with a metallic conductive material, wherein the plurality of molded elements includes a slot connector.

\* \* \* \* \*